(12) United States Patent
Kim

(10) Patent No.: US 9,865,841 B2
(45) Date of Patent: Jan. 9, 2018

(54) ORGANIC LIGHT-EMITTING DISPLAY DEVICE AND METHOD FOR FABRICATING THE SAME

(71) Applicant: LG DISPLAY CO., LTD., Seoul (KR)

(72) Inventor: Jungyeon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/164,370

(22) Filed: May 25, 2016

(65) Prior Publication Data
US 2017/0125729 A1   May 4, 2017

(30) Foreign Application Priority Data

Oct. 31, 2015  (KR) ........................ 10-2015-0152834

(51) Int. Cl.
| H01L 51/52 | (2006.01) |
| H01L 51/56 | (2006.01) |
| H01L 27/32 | (2006.01) |
| H01L 27/12 | (2006.01) |

(52) U.S. Cl.
CPC ...... *H01L 51/5253* (2013.01); *H01L 27/3246* (2013.01); *H01L 27/3248* (2013.01); *H01L 27/3258* (2013.01); *H01L 27/3262* (2013.01); *H01L 51/5246* (2013.01); *H01L 51/5259* (2013.01); *H01L 51/56* (2013.01); *H01L 27/1248* (2013.01); *H01L 2227/323* (2013.01)

(58) Field of Classification Search
None
See application file for complete search history.

(56) References Cited

U.S. PATENT DOCUMENTS

| 2011/0132449 A1* | 6/2011 | Ramadas | H05B 33/04 136/256 |
| 2012/0313508 A1* | 12/2012 | Son | H01L 51/56 313/504 |
| 2013/0240862 A1* | 9/2013 | Yoo | H01L 51/5246 257/40 |
| 2015/0048356 A1* | 2/2015 | Lee | C09J 163/00 257/40 |
| 2015/0060836 A1* | 3/2015 | Shim | H05B 33/04 257/40 |
| 2015/0307750 A1* | 10/2015 | Nishijima | C09J 109/00 428/41.8 |

* cited by examiner

*Primary Examiner* — Lex Malsawma
(74) *Attorney, Agent, or Firm* — Dentons US LLP

(57) ABSTRACT

Provided is an OLED device that includes an adhesive film having a network and a method for fabricating the same.

The OLED device includes: a protective layer covering an organic light-emitting element on a substrate; a metal layer on the protective layer; and an adhesive film between the metal layer and the protective layer to attach the metal layer to the protective layer. The adhesive film includes a first adhesive layer composed of first polymers having a network structure, and a second adhesive layer composed of second polymers having a network structure and moisture absorbent. The network structure of the first polymers is bonded with the network structure of the second polymers at an interface between the first adhesive layer and the second adhesive layer.

20 Claims, 8 Drawing Sheets

ORGANIC LIGHT-EMITTING DISPLAY DEVICE AND METHOD FOR FABRICATING THE SAME

CROSS-REFERENCE TO RELATED APPLICATIONS

This application claims the priority of Korean Patent Application No. 10-2015-0152834 filed on Oct. 31, 2015 in the Korean Intellectual Property Office, the disclosure of which is incorporated by reference as if fully set forth herein.

BACKGROUND

Technical Field

The present disclosure relates to an organic light-emitting display (OLED) device, and more specifically, to an OLED device that includes an adhesive film composed of polymers having a network structure, and a method for fabricating the same.

Description of the Related Art

As information technology has developed, display devices for graphically representing electrical information signals have been in widespread use. In accordance with this, various display panels that can be implemented in devices which are thinner, lighter and consume less power have been developed to replace existing CRTs (Cathode Ray Tubes).

Exemplary display devices include LCD (Liquid Crystal Displays), OLED (Organic Light Emitting Displays), EPD (Electrophoretic Displays, Electronic Paper Displays, PDP (Plasma Display Panels), FED (Field Emission Displays), ELD (Electro Luminescence Displays) device, EWD (Electro-Wetting Displays), and the like. A typical display has a display panel to produce images. Such a display panel includes a pair of substrates attached to each other, with liquid crystal, luminescent material and/or a polarizing material between the substrates.

An organic light-emitting display (OLED) is a self-luminance display and thus, typically does not require an additional light source such as one used in a liquid-crystal display (LCD). Accordingly, OLEDs can be made lighter and thinner. In addition, an OLED is advantageous over an LCD in terms of viewing angle, contrast, power consumption, etc. In addition, OLEDs can be driven with low DC voltage, has fast response speed, is robust to external impact due to its solid-phase internal components, and has a wide range of working temperature.

However, defects may occur in the pixel array of an OLED device due to moisture and oxygen. Accordingly, packaging technology to seal an OLED is important.

SUMMARY

Accordingly, the present disclosure is directed to organic light-emitting display (OLED) device and a method for fabricating the same that substantially obviate one or more problems due to limitations and disadvantages of the related art.

In view of the above, an aspect of the present disclosure is to provide an adhesive film composed of polymers having a particular network structure developed by the present inventors based upon the recognition of certain problems in the related art. Another aspect of the present disclosure is to provide an OLED device employing the adhesive film such that an adhesive layer does not peel off even if a moisture absorbent material absorbs moisture and oxygen to thus expand thereby.

It should be noted that aspects of the present disclosure are not limited to the above-described aspects, and other aspects of the present disclosure will be apparent to those skilled in the art from the following descriptions.

An OLED device according to an exemplary embodiment of the present disclosure includes: a protective layer covering an organic light-emitting element on a substrate; a metal layer on the protective layer; and an adhesive film between the metal layer and the protective layer to attach the metal layer to the protective layer. The adhesive film includes a first adhesive layer composed of first polymers having a network structure, and a second adhesive layer composed of second polymers having a network structure and moisture absorbent. The network structure of the first polymers is bonded with the network structure of the second polymers at an interface between the first adhesive layer and the second adhesive layer.

In addition, according to an exemplary embodiment of the present disclosure, the first polymers and the second polymers minimize the separation between the first adhesive layer and the second adhesive layer by increasing the adhesion with each other.

In addition, according to an exemplary embodiment of the present disclosure, the first polymers and the second polymers are cross-linked polymers.

In addition, according to an exemplary embodiment of the present disclosure, the first polymers and the second polymers are made of at least one selected from a group consisting of polyolefin-based polymers, polyacrylic-based polymers, isobutylene-based polymers, polyamide-based polymers and polyimide-based polymers.

In addition, according to an exemplary embodiment of the present disclosure, the first polymers and the second polymers are made of the same material.

In addition, according to an exemplary embodiment of the present disclosure, a modulus of the second polymers is equal to or less than that of the first polymers.

In addition, according to an exemplary embodiment of the present disclosure, wherein the first polymers and the second polymers have the modulus of from 0.1 MPa to 900 MPa.

In addition, according to an exemplary embodiment of the present disclosure, a ratio of a degree of cross-linking between the first polymers and the second polymers is 1:1 to 1:2.

A display panel according to an exemplary embodiment of the present disclosure includes: an insulation layer covering an organic light-emitting element on a substrate; a lower attaching member on the insulation layer and composed of first polymers bonded with one another in a network structure; and an upper attaching member on the lower attaching member and composed of moisture absorbent and second polymers bonded with one another in a network structure. The first polymers and the second polymers are cross-linked in a network structure at an interface between the lower attaching member and the upper attaching member to increase adhesion between the lower attaching member and the upper attaching member.

In addition, according to an exemplary embodiment of the present disclosure, a top attaching member on the upper attaching member and composed of third polymers bonded with one another in a network structure, and the third polymers and the second polymers are cross-linked in a network structure at an interface between the top attaching member and the upper attaching member to increase adhesion between the top attaching member and the upper attaching member.

A method for fabricating a display device according to an exemplary embodiment of the present disclosure includes: attaching a first adhesive film composed of first polymers, a second adhesive film composed of second polymers and moisture absorbent, and a metal film above and below; forming a sealing layer in which a bonding structure of each of the first polymers and the second polymers is modified by irradiating UV ray onto the first adhesive film and the second adhesive film attached together; and attaching the sealing layer to an array substrate on which an organic light-emitting layer is formed.

In addition, according to an exemplary embodiment of the present disclosure, the forming the sealing layer comprises forming a network structure among the first polymers in the first adhesive film and forming a network structure among the second polymers in the second adhesive film.

In addition, according to an exemplary embodiment of the present disclosure, the forming the sealing layer comprises forming a network structure by cross-linking between the first polymers and the second polymers at an interface between the first adhesive film and the second adhesive film.

According to an exemplary embodiment of the present disclosure, by employing an adhesive film that enhances adhesion between adhesive layers thereof with polymers having a network structure, it is possible to suppress adhesive layers from being peeled off from one another possibly occurring when moisture absorbent expands.

In addition, according to an exemplary embodiment of the present disclosure, it is possible to suppress external moisture and oxygen from permeating into an organic light-emitting element when the adhesive film is peeled off, and thus the lifespan of the OLED device can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF ILLUSTRATED EMBODIMENTS

Figure 1:
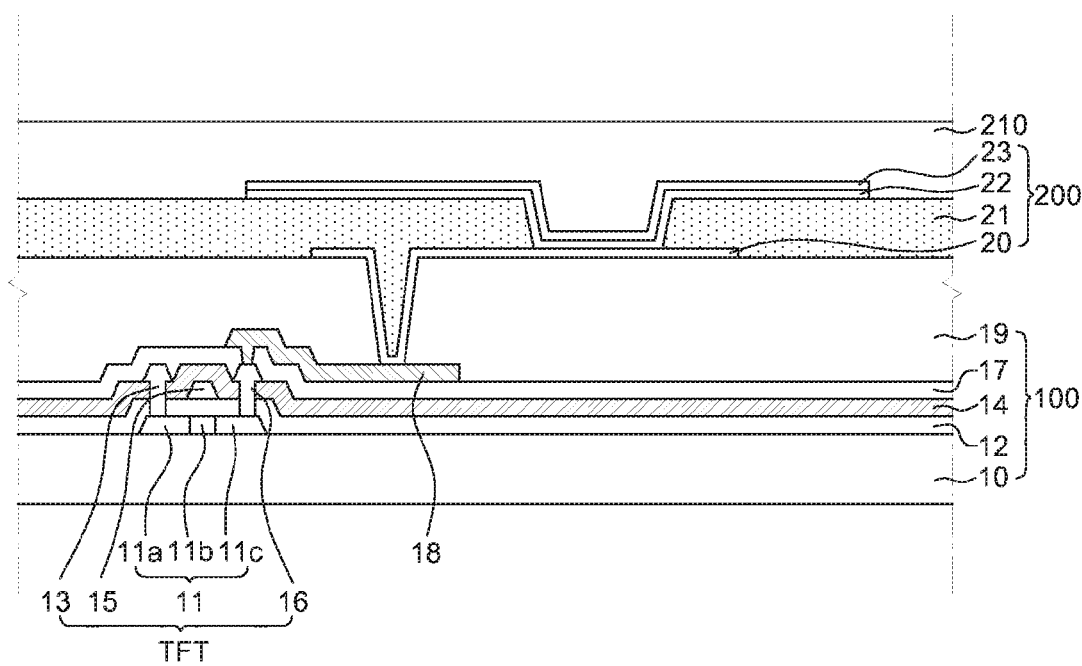
FIG. 1 is a cross-sectional view of an OLED device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, descriptions on well-known technologies may be omitted in order not to obscure the gist of the present disclosure.

It is to be noted that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

As used herein, the terms "x-direction," "y-direction" and "z-direction" are not limited to three orthogonal directions used in the Cartesian coordinate system but have broader directivity to indicate the directions in which the elements of exemplary embodiments of the present disclosure function.

The term "at least one" is to be interpreted as comprising all possible combinations of the elements listed thereafter. For example, the phrase "at least one of a first element, a second element and a third element" may refer to the first element, the second element or the third element, as well as all possible combinations of two or more of them.

Features of various exemplary embodiments of the present disclosure may be combined partially or totally. As will be clearly appreciated by those skilled in the art, technically various interactions and operations are possible. Various exemplary embodiments can be practiced individually or in combination.

When packaging OLED devices, a technique of sealing the entire surface of an OLED device includes forming an adhesive layer over the entire surface of an array substrate having an organic light-emitting element thereon and a seal substrate. Specifically, the technique of sealing includes forming an adhesive layer on the entire surface and then attaching two substrates each other to protect an organic light-emitting element from external moisture and oxygen.

To suppress moisture and oxygen from permeating into the organic light-emitting element, the adhesive layer may include moisture absorbent.

Although the moisture absorbent protects the organic light-emitting element, there is a problem in that the moisture absorbent expands when it absorbs moisture. Accordingly, the moisture content of the moisture absorbent in the adhesive layer increases, the moisture absorbent expands by the moisture to exert stress to an array substrate and a sealing substrate. That is, as the adhesive layer between the array substrate and the sealing substrate expands by the moisture, it may be peeled off.

As the adhesive layer is peeled off, there may be cracks in the adhesive layer. As a result, external moisture and oxygen may permeate into the OLED device via the cracks in the adhesive layer. In addition, the contraction of the adhesive layer becomes bad. If the moisture content of the absorbent is reduced to suppress (or minimize) the adhesive layer from being peeled off (or separated), the adhesive layer cannot effectively suppress moisture and oxygen permeation.

In view of the above, the inventors of the application have studied on a method for protecting an organic light-emitting element to solve the problem that the adhesive layer is peeled off. Accordingly, the inventors of the application propose a novel structure of an OLED device capable of suppressing a dark spot defect of the OLED device and increasing the lifespan, and a method for fabricating the same.

Hereinafter, exemplary embodiments of the present disclosure will be described in detail with reference to the accompanying drawings.

FIG. 1 is a cross-sectional view of an OLED device according to an exemplary embodiment of the present disclosure.

As shown in FIG. 1, an OLED device includes an array substrate 100 and an organic light-emitting element 200.

The array substrate 100 may be divided into a display area and a non-display area. The display area is partitioned into a plurality of pixel areas. In each of the pixel areas, a thin-film transistor TFT and an organic light-emitting element 200 electrically connected to the thin-film transistor TFT are disposed.

The array substrate 100 includes an insulation substrate 10 on which a semiconductor layer 11 including a source region 11a, a channel region 11b and a drain region 11c is disposed. A gate insulation film 12 is disposed on the semiconductor layer 11. A gate line and a gate electrode 15 separated from the gate line are formed on the gate insulation film 12. An interlayer insulation film 14 is disposed on the gate line and the gate electrode 15.

With respect to each pixel, a data line is disposed such that it intersects the gate line with the interlayer insulation film 14 therebetween. In addition, a source electrode 13 and a drain electrode 16 spaced apart from the source electrode 13, which branch off from the data line, are disposed. The source electrode 13 and the drain electrode 16 are electrically connected to the source region 11a and the drain region 11c of the semiconductor layer 11, respectively, via contact holes formed in the gate insulation film 12 and the interlayer insulation film 14 formed on the gate electrode 15.

The thin-film transistor TFT includes the semiconductor layer 11, the gate electrode 15, and the source electrode 13 and the drain electrode 16.

A protective film 17 is disposed on the source electrode 13 and the drain electrode 16. A contact hole is formed in the protective film 17. A connection electrode 18 is disposed on the protective film 17. The drain electrode 16 is electrically connected to the connection electrode 18 via the contact hole formed in the protective film 17. A planarization film 19 is disposed over the entire surface of the array substrate 100 including the thin-film transistor TFT. A contact hole is formed in the planarization film 19. The connection electrode 18 is connected to a lower electrode 20 via the contact hole in the planarization film 19.

The organic light-emitting element 200 is electrically connected to the thin-film transistor TFT via the contact hole formed in the planarization film 19. The organic light-emitting element 200 includes the lower electrode 20, an organic emission layer 22, and an upper electrode 23. The lower electrode 20 of the organic light-emitting element 200 is disposed on the connection electrode 18. In FIG. 1, the lower electrode 20 of the organic light-emitting element 200 is connected to the drain electrode 16 of the thin-film transistor TFT via the connection electrode 18. However, the connection electrode 18 may be eliminated and instead the lower electrode 20 of the organic light-emitting element 200 may be directly connected to the drain electrode 16 of the thin-film transistor TFT via the contact hole in the planarization film 19.

A bank pattern 21 is disposed on the lower electrode 20 in each of the pixel areas, via which the lower electrode 20 is exposed. The organic emission layer 22 is disposed on the exposed part of the lower electrode 20. The organic emission layer 22 may be a single layer structure comprising a luminous material, or may be a multiple layered structure comprising a hole injection layer, a hole transporting layer, an emitting material layer, an electron transporting layer and an electron injection layer so as to improve luminous efficiency. Here any of the layers may be omitted depending upon how the luminous effects are to be achieved, and/or certain functionality of one or more layers may be incorporated into one or more other layers.

The upper electrode 23 is disposed on the organic emission layer 22. In the case that the lower electrode 20 is an anode, the upper electrode is a cathode. In the case that the lower electrode 20 is a cathode, the upper electrode is an anode. A protective layer 210 is disposed on the upper electrode 23 to protect the display elements.

It is to be noted that the array substrate 100 and the organic light-emitting element 200 of the OLED device according to the exemplary embodiments of the present disclosure are not limited to those aspects described above but may be modified without departing from the inventive scope of the present disclosure.

Figure 2:
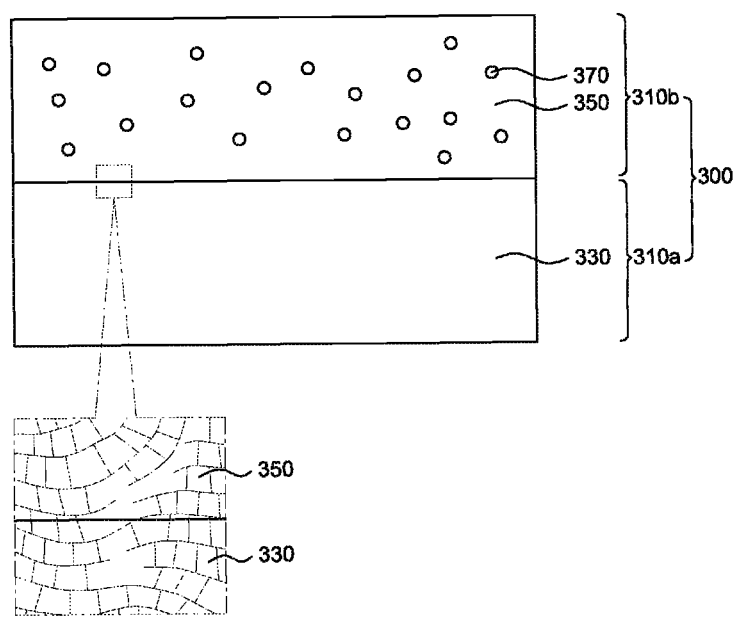
FIG. 2 is a cross-sectional view of an adhesive film according to an exemplary embodiment of the present disclosure.

FIG. 2 is a cross-sectional view of an adhesive film according to an exemplary embodiment of the present disclosure.

An adhesive film 300 is disposed between an array substrate and a metal layer. The adhesive film 300 acts to attach the array substrate and the metal layer. In addition, the adhesive film 300 further seals a protective layer that seals an organic light-emitting element disposed on the array substrate.

As shown in FIG. 2, the adhesive film (or an adhesive member) 300 includes a first adhesive layer 310a (or a lower attaching member) and a second adhesive layer 310b (or an upper attaching member). The first adhesive layer 310a and the second adhesive layer 310b are stacked above and below one another. The first adhesive layer 310a may be attached to the organic light-emitting element or its passivation layer. The second adhesive layer 310b may be attached to the metal layer. Here, it should be noted that more than two adhesive layers may be part of the adhesive film 300.

The first adhesive layer 310a is composed of first polymers 330, and the second adhesive layer 310b is composed of second polymers 350 and a moisture absorbent 370. The thickness of the first adhesive layer 310a may be equal to that of the second adhesive layer 310b. In some embodiments of the present disclosure, the thickness of the first adhesive layer 310a may be different from that of the second adhesive layer 310b. The moisture absorbent 370 of the second adhesive layer 310b absorbs external moisture and oxygen. Accordingly, the thickness of the first adhesive layer 310a may be smaller than that of the second adhesive layer 310b. The ratio between the thickness of the first adhesive layer 310a and the thickness of the second adhesive layer 310b may within a range from 1:3 to 2:3, for example.

The moisture absorbent 370 is contained in the second adhesive layer 310b. The moisture absorbent 370 may suppress moisture and/or oxygen from permeating into the organic light-emitting element. The moisture absorbent 370 may include at least one among barium oxide (BaO), calcium carbonate (CaCO3), calcium oxide (CaO), phosphorus oxide ($P_2O_5$), zeolite, silica gel, alumina, etc. In addition, the absorbent 370 may include a material having a hydrophilic functional group to absorb external moisture and oxygen, for example, a material having a hydrophilic functional group such as carboxyl group, amino group, hydroxyl group, etc.

The moisture absorbent expands when it absorbs moisture and/or oxygen. As the moisture absorbent 370 expands, it may exert stress to the array substrate, the sealing substrate, etc. As a result, the adhesive layer disposed between the array substrate and the sealing substrate may be peeled off or otherwise become loose therefrom. When the adhesive layer is peeled off, cracks may take place in the array substrate, resulting in undesired moisture and/or oxygen permeating into the organic light-emitting element. As such, there is an issue related to the optimal amount of moisture absorbent 370 to be employed. The present inventors recognized this issue, which has been addressed by further improving the adhesive layer to additionally contain polymers with a special network structure.

The first polymers 330 and the second polymers 350 have network structures. Specifically, the first adhesive layer 310a may be composed of the first polymers 330 having a network structure. The second adhesive layer 310b may be composed of the second polymers 350 having a network structure. The second adhesive layer 310b contains the moisture absorbent 370 as well. That is, the adhesive film 300 may include the first adhesive layer 310a composed of the first polymers 330 having a network structure and the second adhesive layer 310b composed of the second polymers 350 having a network structure and the moisture absorbent 370. The first adhesive layer 310a and the second adhesive layer 310b are stacked above and below each other.

The network structure may be formed by irradiating UV rays to the polymers. The network structure may be formed as a result of molecular cross-linking among the polymers.

Cross-linking among the polymers may take place as the functional groups of the polymer chains chemically react with one another. The reaction of the functional groups of the polymer chains may be caused by use appropriate cross-linking agents. A functional group may be bonded to another functional group by chemical or physical bonding between the functional groups of the polymer chains. Numerous cross-linking reactions may take place among the functional groups of the polymer chains. Accordingly, network structure may be formed by such cross-linking among the functional groups of the polymer chains. The network structure is formed by cross-linking among the polymer chains, and thus the polymer chains may not move freely. Accordingly, the polymers having the cross-linked network structure are highly stable.

Referring to an enlarged view of FIG. 2, a cross-linked network structure among the first polymers 330 may be formed by irradiating UV rays onto the first polymers 330. In addition, a cross-linked network structure among the second polymers 350 may be formed by irradiating UV rays to the second polymers 350. That is, the first adhesive layer 310a has the cross-linked network structure among the first polymers 330, and the second adhesive layer 310b has the cross-linked network structure among the second polymers 350.

It should be noted that FIG. 2 merely depicts an exemplary cross-linked network structure, and that the actual physical cross-section may be shaped or configured in a different manner. Also, the actual cross-section configuration may differ depending upon the portion of the adhesive layers. For example, the cross-linked network structure at an interface between two layers may be the same or different from that structure inside of a particular layer. Additionally, although UV irradiation has been explained, other sources of energy or reactive means can be used to cause or trigger the formation of the desired cross-linked network structure. In selecting the appropriate source, the desired display panel operation specifications of the final product or device may need to be considered. For example, if the final product is to be exposed in a high temperature environment, such as a vehicle internal dashboard display, a relatively high dense cross-linked network structure can be produced in order to provide the desired heat resistive properties. On the other hand, if the display device needs to exhibit certain flexible characteristics, a relatively low dense cross-linked network structure could accommodate such flexibility. Besides such display operation specifications, numerous other factors such as manufacturing costs, production yield, etc. can also be considered and various trade-off factors may need to be contemplated in deciding upon what type of cross-linked network structure is to be produced.

In addition, cross-linking between the first polymers 330 of the first adhesive layer 310a and the second polymers 350 of the second adhesive layer 310b may be formed at the surface where the first adhesive layer 310a contacts the second adhesive layer 310b. Accordingly, the network structure of the first polymers 330 and the network structure of the second polymers 350 are cross-linked at the interface between the first adhesive layer 310a and the second adhesive layer 310b. That is, the network structure of the first adhesive layer 310a and the network structure of the second adhesive layer 310b are bonded with each other at the interface therebetween.

Accordingly, the first polymers 330 of the first adhesive layer 310a and the second polymers 350 of the second adhesive layer 310b are bonded with each other by the network structure at the interface between the first adhesive layer 310a and the second adhesive layer 310b. Accordingly, the first polymers 330 and the second polymers 350 are bonded with each other by the cross-linked network structure at the interface between the first adhesive layer 310a and the second adhesive layer 310b, such that the attachment force (or adhesion) between the first adhesive layer 310a and the second adhesive layer 310b is increased. Accordingly, even though the moisture content of the moisture absorbent 370 is increased as the moisture absorbent 370 absorbs moisture and/or oxygen to thus expand and exert stress to the adhesive film 300, it is possible to effectively suppress the first adhesive layer 310a of the adhesive film 300 from being peeled off from the second adhesive layer 310b, when compared to the related art adhesives.

The first polymers 330 and the second polymers 350 may be at least one selected from the group consisting of polyolefin-based polymers, polyacrylic-based polymers, isobutylene-based polymers, polyamide-based polymers and polyimide-based polymers.

In addition, the first polymers 330 and the second polymers 350 may be the same material. Cross-linking between the first polymers 330 and the second polymers 350 at the interface between the first adhesive layer 310a and the second adhesive layer 310b may be more easily formed when the first polymers 330 and the second polymers 350 are made of the same material than when they are made of different materials. Accordingly, the network structure between the first polymers 330 and the second polymers 350 may be more easily formed. As a result, the adhesion between the first adhesive layer 310a and the second adhesive layer 310b can be increased. Accordingly, even though the moisture content of the moisture absorbent 370 is increased as the moisture absorbent 370 absorbs moisture and/or oxygen to expand and exert stress to the adhesive film 300, it is possible to suppress the first adhesive layer 310a of the adhesive film 300 from being peeled off from the second adhesive layer 310b. In addition, the modulus of the first polymers 330 may be equal to the modulus of the second polymers 350.

The modulus may be defined as the value obtained by dividing the maximum load by the cross-sectional area within a range which does not result in losing the elasticity of the material. In a tensile test, for example, a film having a lower modulus can be deformed with a smaller force.

That is, if the modulus of the first polymers 330 may be equal to the modulus of the second polymers 350, they have similar deformation degrees. Accordingly, even when the moisture absorbent 370 of the second adhesive layer 310b absorbs moisture and oxygen to expand, the deformation degree of the second polymers is similar to the deformation degree of the first adhesive layer 310a, such that the first adhesive layer 310a and the second adhesive layer 310b can be attached reliably.

Alternatively, the modulus of the second polymers 350 may be smaller than the modulus of the first polymers 330. Specifically, the deformation degree of the second polymers 350 may be larger than that of the first polymers 330. The second adhesive layer 310b including the second polymers 350 contains the moisture absorbent 370. Accordingly, when the moisture absorbent 370 absorbs moisture and oxygen to expand, the deformation degree of the second polymers 350 of the second adhesive layer 310b is larger than that of the first polymers 330 of the first adhesive layer 310a. Accordingly, the influence on the adhesion between the first adhesive layer 310a and the second adhesive layer 310b is reduced, such that the first adhesive layer 310a and the second adhesive layer 310b can be more reliably attached each other. The modulus of the first polymers 330 and the second polymers 350 may range, but is not limited to, from 0.1 to 900 MPa.

A degree of cross-linking of the first polymers 330 and the second polymers 350 may be equal, or the degree of cross-linking of the second polymer 350 may be higher. The degree of cross-linking of the polymers may be defined as the degree of bonding between chains of a polymer for the network structure having plurality of chain-shaped portions. For example, if the degree of cross-linking of the polymers is high, the polymers may have a high mechanical strength. In addition, if the degree of the cross-linking is proper, an elasticity of the polymers may be increased. If there is a large difference in the degree of cross-linking between the first polymers 330 and the second polymers 350, the degree of cross-linking between the first polymers 330 and the second polymers 350 at the contact surface of the first adhesive layer 310a and the second adhesive layer 310b is reduced. Therefore the network structure may not be easily formed. Accordingly, the ratio of the degree of cross-linking between the first polymers 330 and the second polymers 350 may be within a particular range. For example, the ratio of the degree of cross-linking between the first polymers 330 and the second polymers 350 may range, but is not limited to, from 1:1 to 1:2. The cross-linking agent for cross-linking the second polymers 350 may be added 10 wt % at most. The amount of the cross-linking agent for the first polymers 330 may be determined based on the degree of cross-linking between the first polymers 330 and the second polymers 350.

Figure 3:
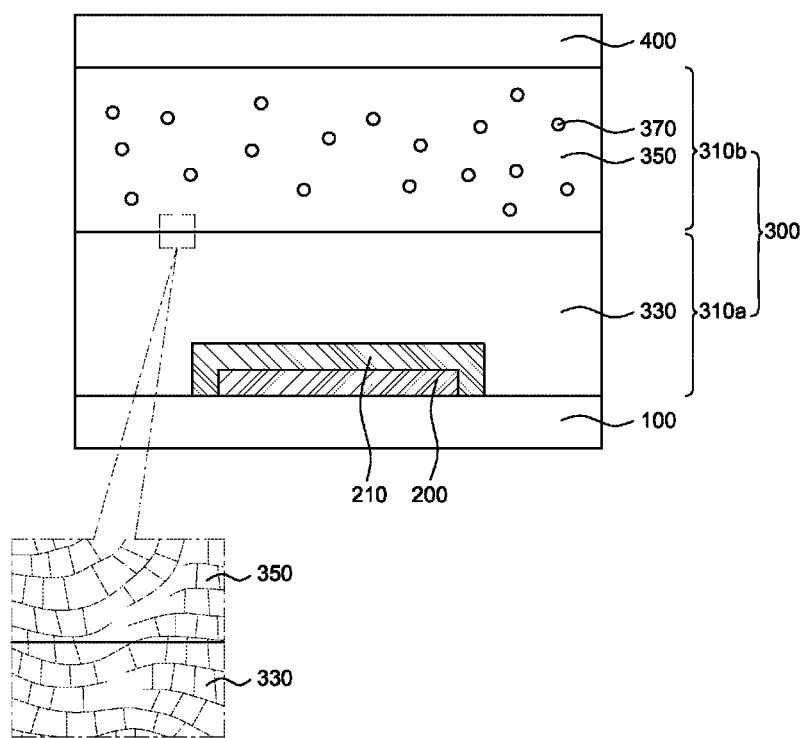
FIG. 3 is a cross-sectional view of an OLED device employing an adhesive film according to an exemplary embodiment of the present disclosure.

FIG. 3 is a cross-sectional view of an OLED device employing an adhesive film according to an exemplary embodiment of the present disclosure.

As shown in FIG. 3, the OLED device according to the exemplary embodiment of the present disclosure is formed by attaching the array substrate 100 shown in FIG. 1 and an organic light-emitting element 200 and a protective layer 210 formed on the array substrate to a metal layer 400, with the adhesive film 300 shown in FIG. 2 therebetween.

The organic light-emitting element 200 is formed on the array substrate 100 including a thin-film transistor such that it is electrically connected to the thin-film transistor. The protective layer 210 is formed on the organic light-emitting element 200. The adhesive film 300 including the first adhesive layer 310a and the second adhesive layer 310b stacked above and below each other is formed over the protective layer 210. In this manner, the first adhesive layer 310a is attached to the protective layer 210. That is, the second adhesive layer 310b containing the moisture absorbent 370 may not be in direct contact with the protective layer 210.

The metal layer 400 is disposed on the second adhesive layer 310b of the adhesive film 300. The metal layer 400 may include insulation glass, metal or plastic. The OLED device is formed by attaching the metal layer 400 to the array substrate 100 on which the organic light-emitting element 200 and the protective layer 210 are formed by the adhesive film 300. In an existing OLED device, if the moisture content of the moisture absorbent 370 of the adhesive film 300 is increased, the moisture absorbent 370 absorbs moisture and/or oxygen to thus expand. When this happens, stress is generated and transferred inside the OLED device, such that the adhesive layer may peel off.

In contrast, the first adhesive layer 310a of the adhesive film 300 according to the exemplary embodiment of the present disclosure may be composed of the first polymers 330 having a particular network structure. The second adhesive layer 310b may be composed of the second polymers 350 having a particular network structure. Accordingly, the first polymers 330 and the second polymers 350 have special network or web-like structures. The second adhesive layer 310b contains the moisture absorbent 370 as well. That is, the adhesive film 300 may include the first adhesive layer 310a composed of the first polymers 330 having a network structure and the second adhesive layer 310b composed of the second polymers 350 having a network structure and the moisture absorbent 370. The first adhesive layer 310a and the second adhesive layer 310b are stacked above and below.

In addition, cross-linking between the first polymers 330 of the first adhesive layer 310a and the second polymers 350 of the second adhesive layer 310b may be formed at the surface where the first adhesive layer 310a contacts the second adhesive layer 310b. Accordingly, the network structure of the first polymers 330 and the network structure of the second polymers 350 are cross-linked at the interface between the first adhesive layer 310a and the second adhesive layer 310b. That is, the network structure of the first adhesive layer 310a and the network structure of the second adhesive layer 310b are bonded with each other at the interface therebetween.

Accordingly, the first polymers 330 of the first adhesive layer 310a and the second polymers 350 of the second adhesive layer 310b are bonded with each other by the network structure at the interface between the first adhesive layer 310a and the second adhesive layer 310b. Accordingly, the first polymers 330 and the second polymers 350 are bonded with each other by the cross-linked network structure at the interface between the first adhesive layer 310a and the second adhesive layer 310b, such that attachment force (or adhesion) between the first adhesive layer 310a and the second adhesive layer 310b is increased. Accordingly, even though the moisture content of the moisture absorbent 370 is increased and the moisture absorbent 370 absorbs moisture and oxygen to expand and exert stress to the adhesive film 300, it is possible to suppress the first adhesive layer 310a of the adhesive film 300 from being peeled off from the second adhesive layer 310b. For example, the second adhesive layer 310b may include, but is not limited to, twice the moisture absorbent 370 of an existing OLED device or greater. That is, the adhesion between the first adhesive layer 310a and the second adhesive layer 310b is increased by the network structure, allowing the second adhesive layer 310b to include more moisture absorbent 370. Accordingly, it is possible to suppress moisture and oxygen from permeating into the organic light-emitting element 200 and in turn into the OLED device.

Figure 4:
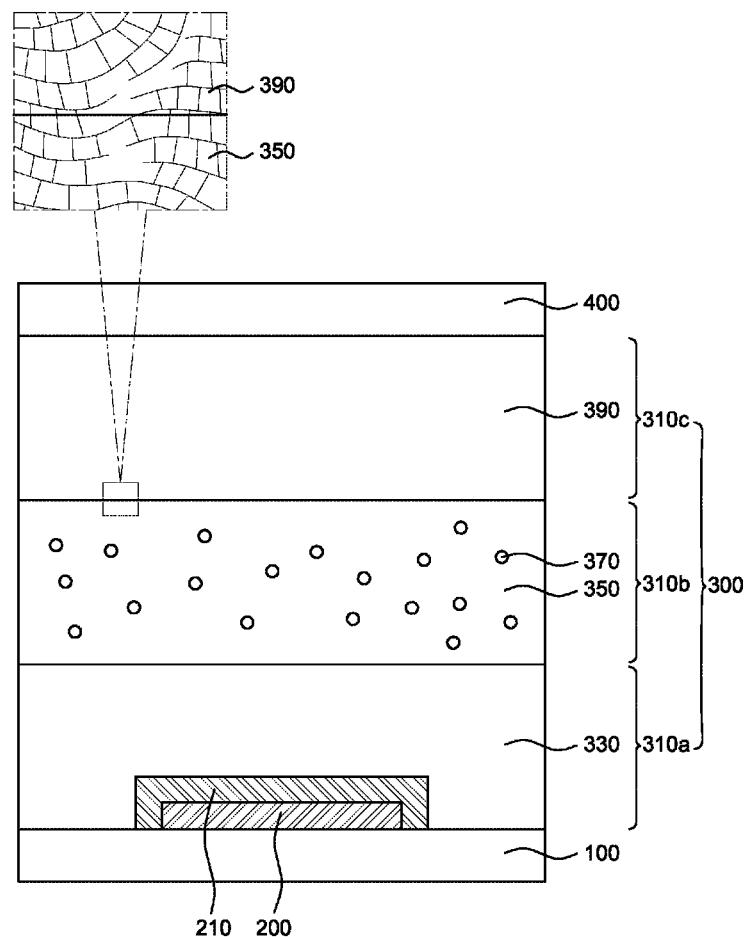
FIG. 4 is a cross-sectional view of an OLED device employing an adhesive film according to another exemplary embodiment of the present disclosure.

FIG. 4 is a cross-sectional view of an OLED device employing an adhesive film according to another exemplary embodiment of the present disclosure.

The OLED device shown in FIG. 4 is substantially identical to the OLED device shown in FIG. 3 except for the structure of the adhesive film 300; and, therefore, the redundant description will not be made.

As shown in FIG. 4, the adhesive film is formed by stacking a first adhesive layer 310a, a second adhesive layer 310b and a third adhesive layer 310c above and below. The first adhesive layer 310a and the second adhesive layer 310b shown in FIG. 4 are substantially identical to the first adhesive layer 310a and the second adhesive layer 310b shown in FIG. 3; and, therefore, the redundant description will not be made.

The third adhesive layer 310c (or top attaching member) is formed on the second adhesive layer 310b. The third adhesive layer 310c is attached to the second adhesive layer 310b. Accordingly, the second adhesive layer 310b may be in contact with neither the protective layer 210 nor the metal layer 400.

The metal layer 400 is disposed on the third adhesive layer 310c of the adhesive film 300. The metal layer 400 may include insulation glass, metal or plastic. The OLED device is formed by attaching the metal layer 400 to the array substrate 100 on which the organic light-emitting element 200 and the protective layer 210 are formed by the adhesive film 300.

Referring to an enlarged view of FIG. 4, the third polymers 390 form the third adhesive layer 310c. The third polymers 390 have a network structure. Accordingly, the third adhesive layer 310c may be composed of the third polymers 390 having a network structure. The network structure of the third polymers 390 may be formed by irradiating UV ray to the third polymers 390 to cross-link the third polymers 390. That is, the third adhesive layer 310c has cross-linked network structure among the third polymers 390.

In addition, cross-linking between the third polymers 390 of the third adhesive layer 310c and the second polymers 350 of the second adhesive layer 310b may be formed at the surface where the third adhesive layer 310c contacts the second adhesive layer 310b. Accordingly, the network structure of the second third polymers 390 and the network structure of the second polymers 350 are cross-linked at the interface between the third adhesive layer 310c and the second adhesive layer 310b. That is, the network structure of the third adhesive layer 310c and the network structure of the second adhesive layer 310b are bonded with each other at the interface therebetween.

The third polymers 390 of the third adhesive layer 310c and the second polymers 350 of the second adhesive layer 310b are bonded with each other by the network structure. Accordingly, the third polymers 390 and the second polymers 350 are bonded with each other by the cross-linked network structure at the interface between the third adhesive layer 310c and the second adhesive layer 310b. Therefore adhesion between the third adhesive layer 310c and the second adhesive layer 310b is increased. Accordingly, even though the moisture content of the moisture absorbent 370 is increased and the moisture absorbent 370 absorbs moisture and oxygen to expand and exert stress to the adhesive film 300, it is possible to suppress the third adhesive layer 310c of the adhesive film 300 from being peeled off from the second adhesive layer 310b.

For example, the second adhesive layer 310b may include, but is not limited to, twice or greater the moisture absorbent 370 of an OLED device. Since the adhesion between the third adhesive layer 310c and the second adhesive layer 310b is increased such that the second adhesive layer 310b can include more moisture absorbent 370, it is possible to suppress moisture and oxygen from permeating into the organic light-emitting element 200. That is, it is possible to suppress the moisture permeation into the OLED device.

The third polymers 390 may be made of at least one selected from the group consisting of polyolefin-based polymers, polyacrylic-based polymers, isobutylene-based polymers, polyamide-based polymers and polyimide-based polymers.

That is, the adhesive film 300 of the OLED device shown in FIG. 4 includes at least three adhesive layers. Accordingly, even if the moisture absorbent 370 of the second adhesive layer 310b absorbs moisture and oxygen to expand, it is possible to suppress the adhesive layers from being peeled off from another. In addition, the moisture content of the moisture absorbent 370 of the second adhesive layer 310b can be increased by twice to three times, it is possible to more effectively suppress moisture and/or oxygen from permeating into the organic light-emitting element 200. That is, it is possible to further suppress moisture and/or oxygen permeation into the OLED device.

FIGS. 5A to 5D are cross-sectional views for illustrating a method for fabricating a display device according to an exemplary embodiment of the present disclosure. Specifically, FIGS. 5A to 5D show processing steps of the method.

Figure 5A:
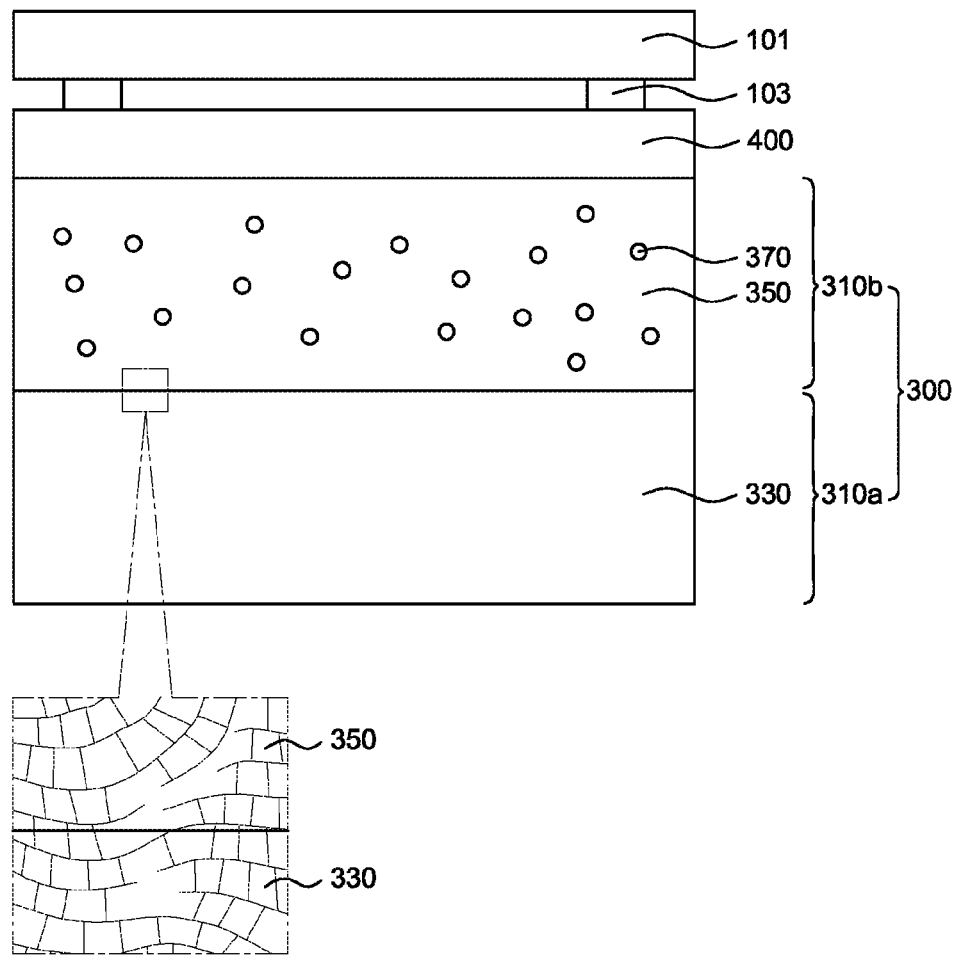
FIGS. 5A to 5D are cross-sectional views for illustrating a method for fabricating a display device according to an exemplary embodiment of the present disclosure.

Referring to FIG. 5A, a first adhesive layer 310a, a second adhesive layer 310b and a metal layer 400 are attached together.

The first adhesive layer 310a (or a first adhesive film), the second adhesive layer 310b (or a second adhesive film) and the metal layer 400 (or a metal film) are attached each other above and below. After attaching them together, the metal layer 400 is placed on a die holder (or tray) 101. The die holder 101 has an adhesive member 103 attached thereto. The metal layer 400 is attached to the adhesive member 103.

The first adhesive layer 310a is composed of first polymers 330, and the second adhesive layer 310b is composed of second polymers 350 and moisture absorbent 370. The thickness of the first adhesive layer 310a may be equal to that of the second adhesive layer 310b. In addition, the thickness of the first adhesive layer 310a may be different from that of the second adhesive layer 310b. For example, the ratio between the thickness of the first adhesive layer 310a and the thickness of the second adhesive layer 310b may range from 1:3 to 2:3.

The metal layer 400 may include, but is not limited to, insulation glass, metal or plastic.

Figure 5B:
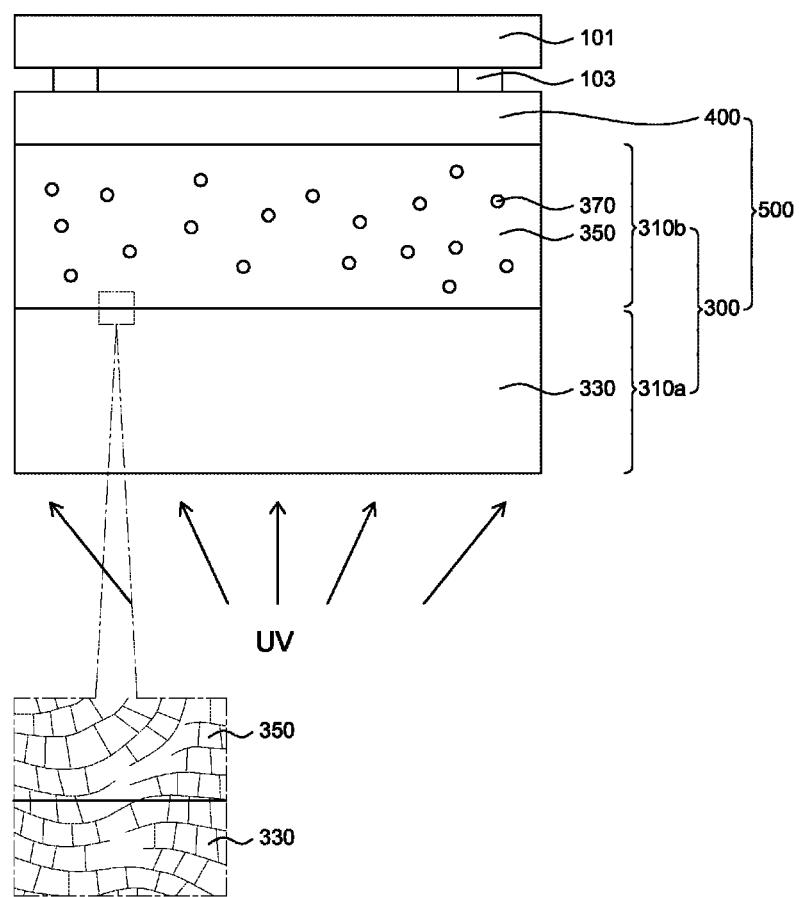

Referring to FIG. 5B, UV ray is irradiated to the first adhesive layer 310a and the second adhesive layer 310b. By irradiating the UV ray to the first adhesive layer 310a and the second adhesive layer 310b, a sealing layer with modified bonding structure is formed.

When the UV ray is irradiated, the first polymers 330 of the first adhesive layer 310a are cross-linked, and the second polymers 350 of the second adhesive layer 310b are cross-linked. In addition, the first polymers 330 and the second polymers 350 are cross-linked at the interface between the first adhesive layer 310a and the second adhesive layer 310b. Accordingly, a network structure among the first polymers 330 is formed in the first adhesive layer 310a, and a network structure among the second polymers 350 is formed in the second adhesive layer 310b. In addition, a cross-linked network structure between the first polymers 330 and the second polymers 350 are formed at the interface between the first adhesive layer 310a and the second adhesive layer 310b.

Since the first polymers 330 and the second polymers 350 are bonded with each other by the cross-linked network structure at the interface between the first adhesive layer 310a and the second adhesive layer 310b, the adhesion between the first adhesive layer 310a and the second adhesive layer 310b can be increased. As a result, it is possible to suppress the first adhesive layer 310a from being peeled off from the second adhesive layer 310b. Further, even though the moisture content of the moisture absorbent 370 of the second adhesive layer 310b is increased and it absorbs moisture and oxygen to expand, the stress caused by the expansion of the absorbent 370 may be suppressed by the network structure between the first polymers 330 of the first adhesive layer 310a and the second polymers 350 of the second adhesive layer 310b.

Figure 5C:
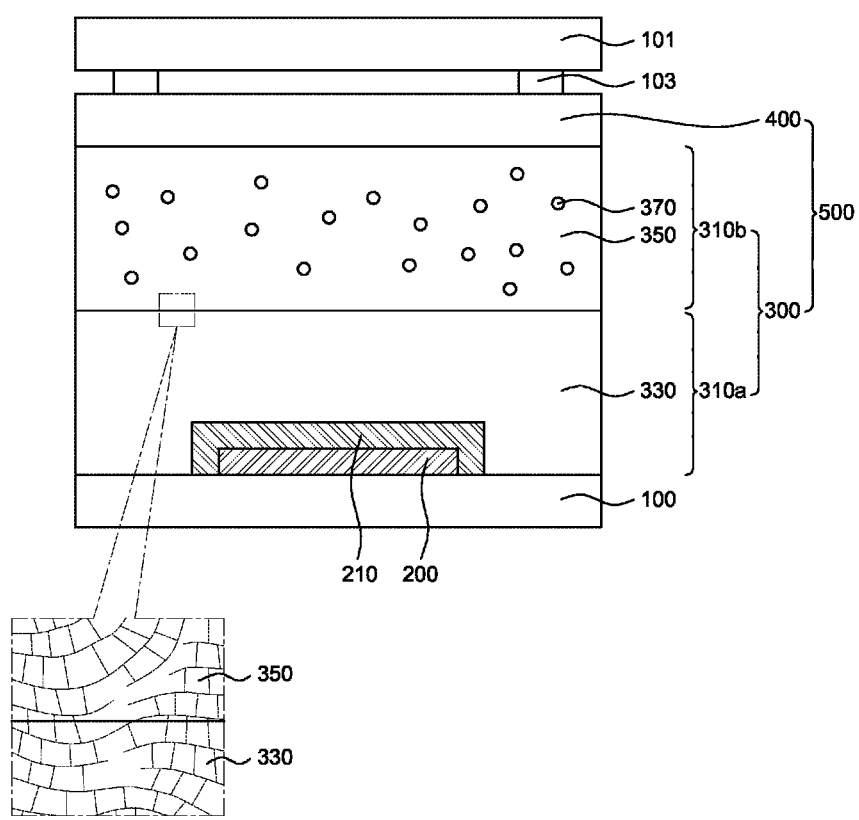

Referring to FIG. 5C, the sealing layer with modified bonding structure is attached to the array substrate 100 on which the organic light-emitting layer is formed.

The organic light-emitting element 200 is formed on the array substrate 100. The organic light-emitting element 200 includes an organic emission layer. The protective layer 210 is formed on the organic light-emitting element 200. The protective layer 210 may seal the organic light-emitting element 200. The sealing layer is disposed on the organic light-emitting element 200 sealed with the protective layer 210.

The adhesive layer 300 of the sealing layer may be attached to the array substrate 100 on which the organic light-emitting element 200 is formed by pressing the die holder 101. The first adhesive layer 310a of the adhesive layer 300 may cover the protective layer 210. Accordingly, the first adhesive layer 310b may be formed such that it seals the protective layer 210.

Figure 5D:
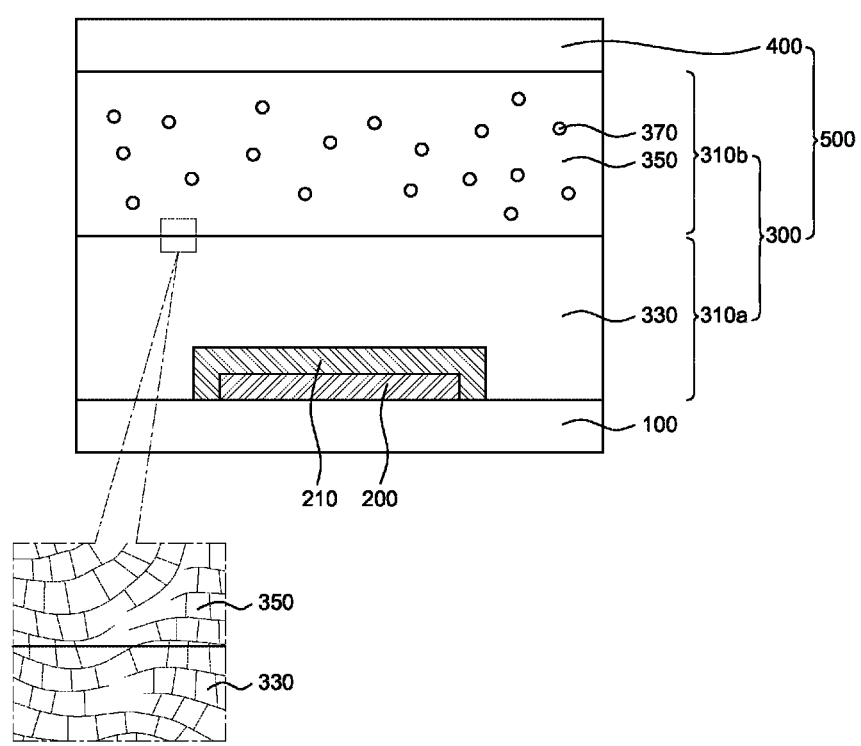

Referring to FIG. 5D, the die holder 101 is separated from the sealing layer.

The adhesive member 103 fixing the sealing layer to the die holder 101 contains a foaming agent and a viscous component. The viscous component encloses the foaming agent. In other words, the foaming agent is included in the viscous component. The foaming agent expands by heat. Accordingly, the adhesion of the adhesive member 103 becomes weak. As a result, the die holder 101 can be easily separated from the sealing layer.

The exemplary embodiments of the present disclosure can also be described as follows:

According to an aspect of the present disclosure, there is provided an OLED device. The OLED includes: a protective layer covering an organic light-emitting element on a substrate; a metal layer on the protective layer; and an adhesive film between the metal layer and the protective layer to attach the metal layer to the protective layer. The adhesive film includes a first adhesive layer composed of first polymers having a network structure, and a second adhesive layer composed of second polymers having a network structure and moisture absorbent. The network structure of the first polymers is bonded with the network structure of the second polymers at an interface between the first adhesive layer and the second adhesive layer.

The first polymers and the second polymers may increase adhesion between the first adhesive layer and the second adhesive layer to suppress the first adhesive layer or the second adhesive layer from being peeled off from the other.

The first polymers and the second polymers may be cross-linked polymers.

The first polymers and the second polymers may be made of at least one selected from a group consisting of polyolefin-based polymers, polyacrylic-based polymers, isobutylene-based polymers, polyamide-based polymers and polyimide-based polymers.

The first polymers and the second polymers may be of the same material.

The modulus of the second polymers may be equal to or less than that of the first polymers.

The first polymers and the second polymers may have the modulus between 0.1 MPa and 900 MPa.

The ratio of the degree of cross-linking between the first polymers and the second polymers may range from 1:1 to 1:2.

According to another aspect of the present disclosure, there is provided a display panel. The display panel includes: an insulation layer covering an organic light-emitting element on a substrate; a lower attaching member on the insulation layer and composed of first polymers bonded with one another in a network structure; and an upper attaching member on the lower attaching member and composed of moisture absorbent and second polymers bonded with one another in a network structure. The network structure of the first polymers and the network structure of the second polymers are cross-linked at an interface between the lower attaching member and the upper attaching member to increase adhesion between the lower attaching member and the upper attaching member.

The display panel may further include: a top attaching member on the upper attaching member and composed of third polymers bonded with one another in a network structure. The network structure of the third polymers and the network structure of the second polymers are cross-linked at an interface between the top attaching member and the upper attaching member to increase adhesion between the top attaching member and the upper attaching member.

According to another aspect of the present disclosure, there is provided a method for fabricating an OLED device. The method includes: attaching a first adhesive film composed of first polymers, a second adhesive film composed of second polymers and moisture absorbent, and a metal film above and below; forming a sealing layer in which a bonding structure of each of the first polymers and the second polymers is modified by irradiating UV ray onto the first adhesive film and the second adhesive film attached together; and attaching the sealing layer to an array substrate on which an organic light-emitting layer is formed.

The forming the sealing layer may include: forming a network structure among the first polymers in the first adhesive film; and forming a network structure among the second polymers in the second adhesive film.

The forming the sealing layer may include: forming cross-link between the network structure of the first polymers and the network structure of the second polymers at an interface between the first adhesive film and the second adhesive film.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. An organic light-emitting display (OLED) device comprising:
    a protective layer covering an organic light-emitting element on a substrate;
    a metal layer on the protective layer; and
    an adhesive film between the metal layer and the protective layer and configured to attach the metal layer and the protective layer, the adhesive film comprising:
    a first adhesive layer composed of first polymers having a network structure, and a second adhesive layer composed of second polymers having a network structure and moisture absorbent, and
    wherein the first polymers and the second polymers are bonded with the network structure at a contact surface of the first adhesive layer and the second adhesive layer, and
    wherein a deformation degree of the second polymers is larger than that of the first polymers.

2. The OLED device of claim 1, wherein the first polymers and the second polymers minimize a separation between the first adhesive layer and the second adhesive layer due to expansion of the moisture absorbent by increasing an adhesion with each other.

3. The OLED device of claim 1, wherein the first polymers and the second polymers are cross-linked polymers.

4. The OLED device of claim 1, wherein the first polymers and the second polymers are made of at least one selected from a group consisting of polyolefin-based polymers, polyacrylic-based polymers, isobutylene-based polymers, polyamide-based polymers and polyimide-based polymers.

5. The OLED device of claim 4, wherein the first polymers and the second polymers are made of the same material.

6. The OLED of claim 5, wherein a thickness of the first adhesive layer is smaller than that of the second adhesive layer.

7. The OLED device of claim 1, wherein a modulus of the second polymers is equal to or less than that of the first polymers.

8. The OLED device of claim 7, wherein the first polymers and the second polymers have the modulus of from 0.1 MPa to 900 MPa.

9. The OLED device of claim 1, wherein a ratio of a degree of cross-linking between the first polymers and the second polymers is 1:1 to 1:2.

10. The OLED device of claim 1, further comprising:
    a top attaching member on the second adhesive layer and composed of third polymers bonded with one another in a network structure,
    wherein the third polymers and the second polymers are cross-linked in a network structure at an interface between the top attaching member and the second adhesive layer to increase adhesion between the top attaching member and the second adhesive layer.

11. A display panel comprising:
    an insulation layer covering an organic light-emitting element on a substrate;
    a lower attaching member on the insulation layer and composed of first polymers bonded with one another in a network structure; and
    an upper attaching member on the lower attaching member and composed of moisture absorbent and second polymers bonded with one another in a network structure, and
    wherein the first polymers and the second polymers are cross-linked in a network structure at an interface between the lower attaching member and the upper attaching member to increase adhesion between the lower attaching member and the upper attaching member, such increased adhesion of the cross-linked network structure being sufficient to suppress physical stress at the interface caused by expansion of the moisture absorbent.

12. The display panel of claim 11, further comprising:
    a top attaching member on the upper attaching member and composed of third polymers bonded with one another in a network structure,
    wherein the third polymers and the second polymers are cross-linked in a network structure at an interface between the top attaching member and the upper attaching member to increase adhesion between the top attaching member and the upper attaching member.

13. The display panel of claim 11, wherein a modulus of the second polymers is less than that of the first polymers.

14. The display panel of claim 11, wherein a ratio of a degree of cross-linking between the first polymers and the second polymers is 1:1 to 1:2.

15. The display panel of claim 14, wherein a thickness of the lower adhesive layer is smaller than that of the upper adhesive layer.

16. The display panel of claim 15, wherein the first polymers and the second polymers are cross-linked polymers made of at least one selected from a group consisting of polyolefin-based polymers, polyacrylic-based polymers, isobutylene-based polymers, polyamide-based polymers and polyimide-based polymers.

17. The display panel of claim 16, wherein the first polymers and the second polymers are made of the same material.

18. A method for fabricating a display device, the method comprising:
  attaching a first adhesive film composed of first polymers, a second adhesive film composed of second polymers and moisture absorbent, and a metal film above and below;
  forming a sealing layer in which a bonding structure of each of the first polymers and the second polymers is modified by irradiating UV rays to the first adhesive film and the second adhesive film attached; and
  attaching the sealing layer to an array substrate on which an organic light-emitting layer is formed,
  wherein the forming the sealing layer comprises forming a network structure by cross-linking between the first polymers and the second polymers at an interface between the first adhesive film and the second adhesive film.

19. The method of claim 18, wherein the forming the sealing layer comprises:
  forming a network structure among the first polymers in the first adhesive film; and
  forming a network structure among the second polymers in the second adhesive film.

20. The method of claim 18, wherein a modulus of the second polymers is smaller than the modulus of the first polymers.

* * * * *